(12) United States Patent
Hildebrant

(10) Patent No.: US 7,137,083 B2
(45) Date of Patent: Nov. 14, 2006

(54) VERIFICATION OF INTEGRATED CIRCUIT TESTS USING TEST SIMULATION AND INTEGRATED CIRCUIT SIMULATION WITH SIMULATED FAILURE

(75) Inventor: Andrew S. Hildebrant, Loveland, CO (US)

(73) Assignee: Verigy IPco, Singapore (SG)

( * ) Notice: Subject to any disclaimer, the term of this patent is extended or adjusted under 35 U.S.C. 154(b) by 239 days.

(21) Appl. No.: 10/815,521

(22) Filed: Apr. 1, 2004

(65) Prior Publication Data

US 2005/0229121 A1    Oct. 13, 2005

(51) Int. Cl.
G06F 17/50    (2006.01)
G06F 9/45    (2006.01)

(52) U.S. Cl. .................... 716/4; 716/5; 703/13

(58) Field of Classification Search ........... 716/1–6, 716/17, 18; 703/13–17, 22, 1, 2; 714/715
See application file for complete search history.

(56) References Cited

U.S. PATENT DOCUMENTS

| | | | | |
|---|---|---|---|---|
| 4,763,289 A | * | 8/1988 | Barzilai et al. ............. 703/2 |
| 5,414,715 A | * | 5/1995 | Hamblin et al. ............ 714/724 |
| 5,515,384 A | * | 5/1996 | Horton, III .................. 714/732 |
| 5,822,218 A | * | 10/1998 | Moosa et al. .................. 716/4 |
| 6,141,630 A | * | 10/2000 | McNamara et al. ........... 703/14 |
| 6,170,078 B1 | * | 1/2001 | Erle et al. ........................ 716/4 |
| 6,594,610 B1 | * | 7/2003 | Toutounchi et al. ......... 702/117 |
| 6,707,313 B1 | * | 3/2004 | Rohrbaugh et al. .......... 324/765 |
| 6,876,934 B1 | * | 4/2005 | Marlett .......................... 702/58 |
| 2002/0184587 A1 | * | 12/2002 | Boateng ..................... 714/738 |

* cited by examiner

Primary Examiner—Vuthe Siek
Assistant Examiner—Nghia M. Doan

(57) ABSTRACT

A method and apparatus for verifying an integrated circuit device test for testing an integrated circuit device on an automated tester is presented. An integrated circuit device simulator simulates a flawed integrated circuit device that models one or more known flaws, or physical defects, in an assumed good integrated circuit device design. A tester simulator simulates the integrated circuit device test which sends stimuli to, and receives responses from, the simulated flawed integrated circuit device. A test analyzer then determines whether the simulated test of the simulated flawed integrated circuit device detected the flaws in the simulated flawed integrated circuit device and properly failed the simulated flawed integrated circuit device.

30 Claims, 6 Drawing Sheets

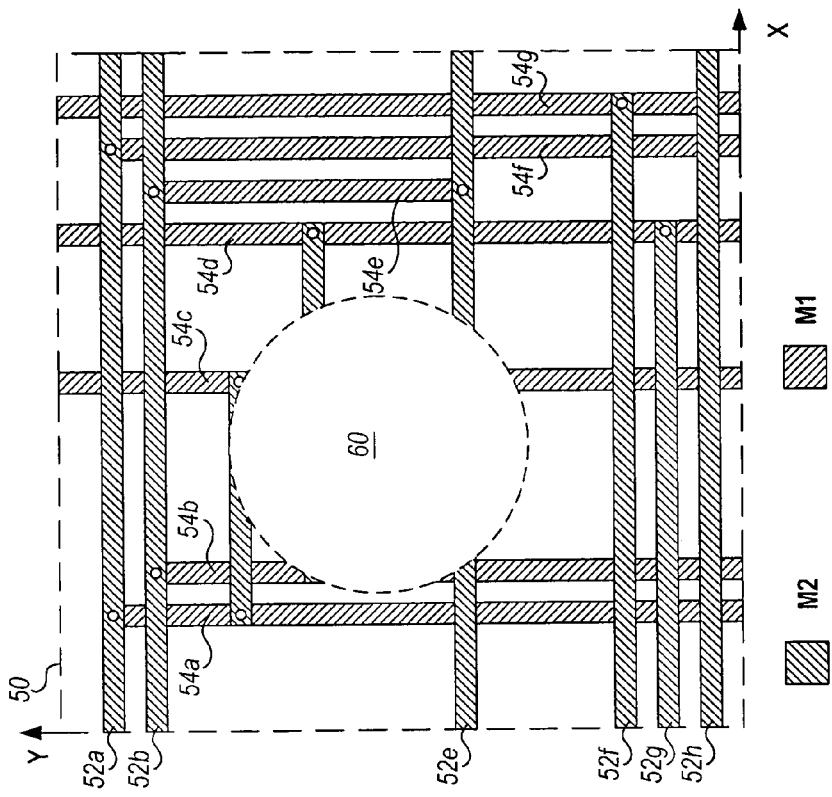
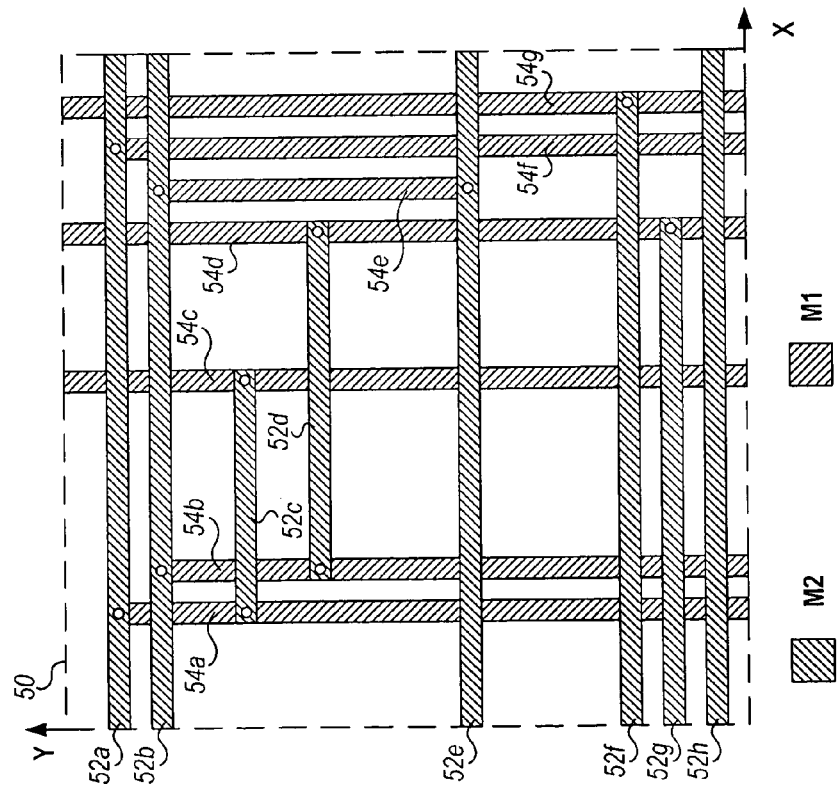
FIG. 3A
FIG. 3B

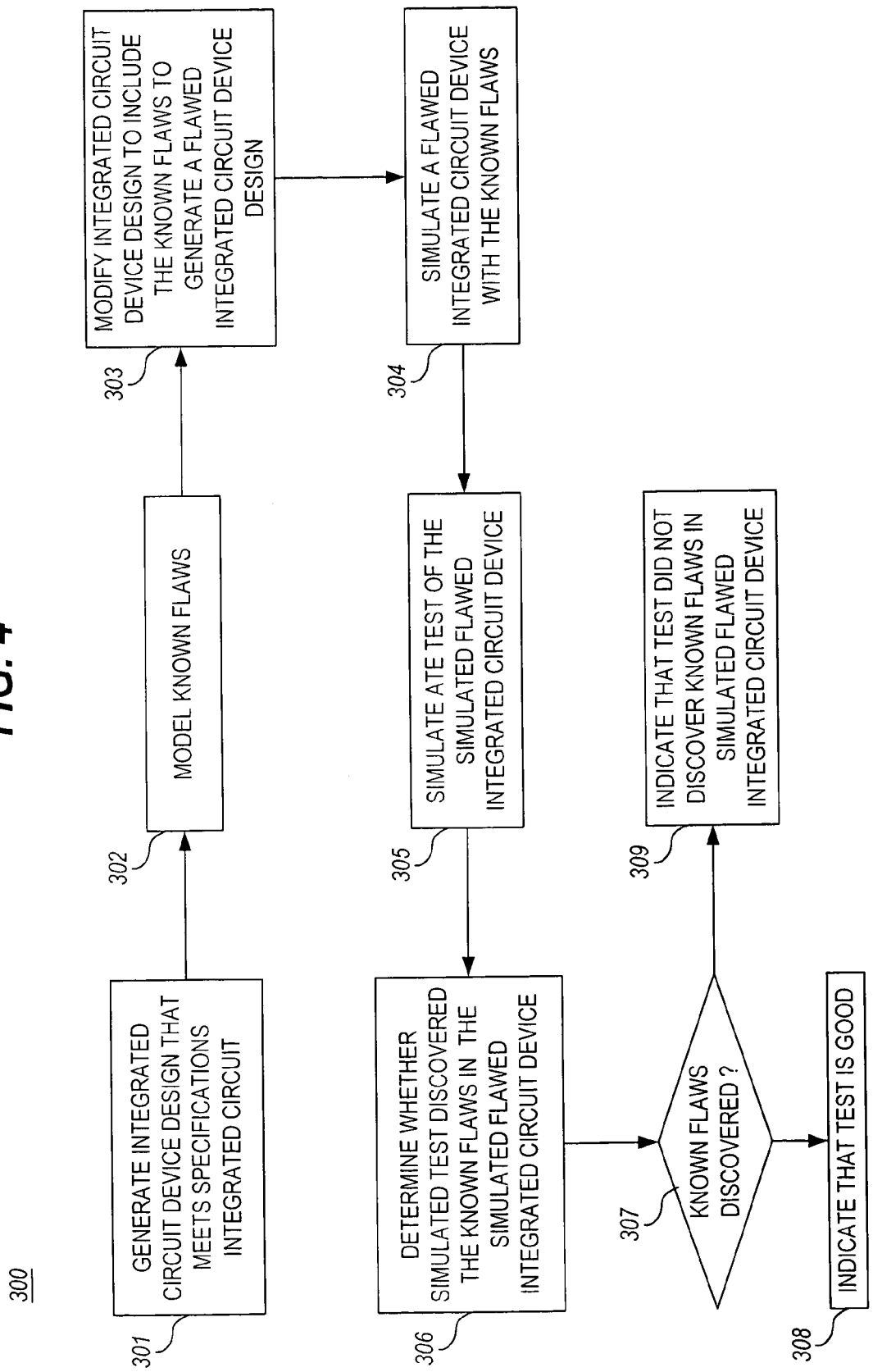

VERIFICATION OF INTEGRATED CIRCUIT TESTS USING TEST SIMULATION AND INTEGRATED CIRCUIT SIMULATION WITH SIMULATED FAILURE

BACKGROUND OF THE INVENTION

The present invention relates generally to electronic circuit testing, and more particularly to a method and system for verifying the reliability of an integrated circuit device test using test simulation and integrated circuit device sin with simulated integrated circuit flaws representative of known integrated circuit defects.

The increasing reliance upon computer systems in every industrial and economic sector has led to the continuous improvement of the system hardware and associated processes that run on the hardware. While smaller processes, increased density, and faster speeds of integrated circuits have revolutionized the size and capability of today's computerized products, these same integrated circuit improvements have dramatically increased the cost and complexities of designing and testing such devices.

Currently, integrated multi-functional Electronic Automation Design (EAD) tools are used to design and simulate integrated circuit devices. The design of an integrated circuit device involves synthesizing device components to meet the device specification, which includes requirements for both device functionality and device timing. The design is typically verified against the device specification via simulation. A simulator, typically integrated into the EAD tool, simulates the operation of the design by applying a set of input stimulus to the synthesized design, and receiving and monitoring a set of simulated output responses. The input stimuli are designed to test the functionality and timing of the design against the requirements of the device specification. The simulator compares the simulated output responses to expected output response values to verify operation of the design. Once a design is satisfactorily verified against the device specification, a physical implementation of the device (e.g., a "prototype") is generated and tested using the simulation test data, including respective pairs of input stimulus and expected output response to verify expected operation of the physical device against the design.

Simulator tools generally output simulation test data, including respective pairs of input stimulus and expected output response, to files formatted according to what is known in the industry as "event-based" data formats. Examples of event-based data formats include the IEEE Standard 1364-2001 Verilog Change Dump (VCD) format, or the IEEE Standard 1450-1999 Standard Test Interface Language (STIL) format. A VCD event-based data file, for example, typically contains header information, variable definitions (e.g., pin number or name definitions), and the timescale used. Next, the file typically contains definitions of the scope and type of variables being dumped, followed by the actual value changes at each simulation time increment. Only the variables that change value during a time increment are listed.

In contrast, the integrated circuit device testers, such as large complex industrial Automated Test Equipment (ATE), typically require input test data formatted according to a "cycle-based" data format. A cycle-based data format generally includes a set of vectors and a set of waveforms defined by a fixed device cycle time.

The event-based and cycle-based data file formats are incompatible. Accordingly, in order to utilize the simulation test data generated by the simulator to verify operation of the prototype, or to verify operation of manufactured devices during production, the event-based simulation test data must be converted to cycle-based test data compatible with the particular ATE that will test the physical device.

A translator tool typically performs the conversion of event-based simulation test data to cycle-based test data appropriate to the particular ATE testing the prototype or device under test (DUT). During the design process, the designer assumes an ideal testbench (i.e., that the tester simulation is ideal). However, because the tester simulator tester simulator can only model or approximate the behavior of the actual tester. Accordingly, when the real (actual physical) tester executes the simulation test data on the physical device under test, the test may behave differently than it did during simulation. In addition, because the event-based data must be cyclized by the translator tool, the test undergoes a translation from one test data format to another. However, in general, when any form of translation is performed on a test, a potential exists of materially changing the test. Accordingly, a test that operated correctly during simulation may not necessarily operate correctly when executed on the actual tester. This may generate misleading results. For example, if a test that properly passed simulated integrated circuit devices during simulation fails a physical embodiment of the integrated circuit device on the actual tester, the device may not necessarily be flawed; it may have been failed because the test itself is flawed, either due to translation problems or to flaws in the tester simulator used in the design of the integrated circuit.

In the production environment, time is of the essence. In terms of time-to-market, waiting for fabrication of a physical embodiment of the integrated circuit device (often referred to as waiting for "first silicon" or a later version of "silicon") can be wasteful. In addition, because tester time is expensive and once silicon arrives, it is highly desirable to begin testing right away without having to simultaneously debug the test.

Accordingly, a process called "resimulation" or "virtual test" is often performed prior to the arrival of the physical embodiment of the integrated circuit device in order to test and debug the test. Resimulation attempts to detect flaws in the test itself prior to actual execution of the test on the tester. Resimulation has the advantage in that it can be performed in parallel to the fabrication of the physical integrated circuit device to be tested so that the test will be ready and "bug"-free when the physical embodiment of the integrated circuit device is available for testing on the tester. Resimulation uses a resimulation tool, which can use the same or a different simulator as that used to generate the test itself, that imports a tester-specific library that will generate the stimuli and receive simulated responses according to an ATE specific testbench that simulates/emulates the particular tester that will actually test the physical integrated circuit device.

Resimulation, or "virtual testing", describes a software simulation of ATE testing an IC device. A virtual test typically has two main parts: the tester simulation (also referred to herein as "testbench"), and the integrated circuit device simulation. The testbench simulates or emulates the ATE, sending stimulus to, and receiving expected results from, the simulated integrated circuit device. The integrated circuit device simulation emulates the integrated circuit device being designed and/or tested based on the integrated circuit design generated during the design process.

Generally, the purpose of virtual testing is to debug the ATE test before silicon is physically available. This implies a "potentially flawed test, good design, good chip"

approach. Sometimes virtual testing is also used to detect design flaws before expensive masks and first silicon are produced (corresponding to a "good test, bad design, good chip" approach).

It will be appreciated that a test really has two purposes: (1) pass good parts, and (2) fail bad parts. Current test development heavily favors only the first purpose of the test.

Resimulation allows verification of test prior to actual execution of the test on a tester. However, a test is only as good as the test coverage it provides. Test coverage is typically discussed in terms of "faults" and "defects". A "defect" is a physical flaw on the integrated circuit that may be the result of poor design (e.g., missing links), poor fabrication (e.g., malformed vias or solder connections), or external events (e.g., particle contamination, change in environment such as a change in temperature that destroys all or a portion of the device). A "fault" is a model of a problem (e.g., a bit is stuck in a high or low state, or the operating current of the device is above a pre-defined threshold). For example, a stuck-at "fault" may indicate that a link of a transistor is broken, whereas the "defect" that caused the fault may be that the metal lines that fabricate the transistor were laid down incorrectly.

Test development is faced with two practical issues, among others. The first is that faults are more easily identifiable and translatable into a structural or functional test than actual defects. The second is that fabrication of integrated circuit devices is expensive and time-consuming. Therefore, test development tends to be focused on detecting identifiable faults and passing good parts if they do not exhibit the faults. In the test development environment, these goals often translate to the development of a test that heavily favors not failing good parts. The result of the test development process is that the test will not fail good parts. However, in meeting these criteria, the second purpose of test, namely, verifying that the test does not pass bad parts, is frequently overlooked.

In addition, because the test development process favors fault modeling (or detection of symptoms of defects rather than the defect itself), the test may actually miss detection of the defect itself, and falsely pass a defective part. What is needed, therefore, is a technique for verifying that that a test fails parts with actual defects rather than merely detecting the symptoms of defects through fault detection.

Accordingly, the invention allows simulation of the integrated circuit device as if it had known defects, rather than merely fault modeling the device, and verifies that the test actually catches the defects.

SUMMARY OF THE INVENTION

The present invention is a method and apparatus for verifying the ability of an integrated circuit device test to fail bad parts with known defects prior to actual execution of the test on an actual integrated circuit device tester. In accordance with the invention, given an integrated circuit device design that meets predetermined specifications of an integrated circuit and a set of known flaws (i.e., that model actual integrated circuit defects), the integrated circuit device design is modified to model the known defects to generate a flawed integrated circuit device design. A tester simulator simulates the integrated circuit device test, and a integrated circuit device simulator simulates a flawed integrated circuit device based on the flawed integrated circuit device design. The simulated test sends test stimuli to the simulated flawed integrated circuit device and receives test responses from the flawed integrated circuit device. If the simulated test detects the known flaws in the simulated flawed integrated circuit device, and thereby correctly fails the simulated flawed integrated circuit device, the test is considered good for failing similarly flawed physical embodiments of the integrated circuit device to be tested.

Often manufacturing engineers have historical (or predicted) data of common integrated circuit fabrication defects that cause bad chips. Typical flaws are due to process variations, dust, chemical contaminants, and other factors. By allowing manufacturing problems to be simulated during virtual test (using a "potentially flawed test, good design, intentionally bad chip" approach), test development engineers can easily verify that their ATE tests detect common expected problems prior to actual availability of the physical embodiments of the integrated circuit devices.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein:

FIG. 3A is a top view of a portion of an integrated circuit illustrating metalization layers M1 and M2;

FIG. 3B is a top view of the portion of the integrated circuit of FIG. 3A illustrating metalization layers M1 and M2 that has been contaminated by a particle;

FIG. 4 is a flowchart of an exemplary embodiment of a method of the invention.

DETAILED DESCRIPTION

Figure 1:
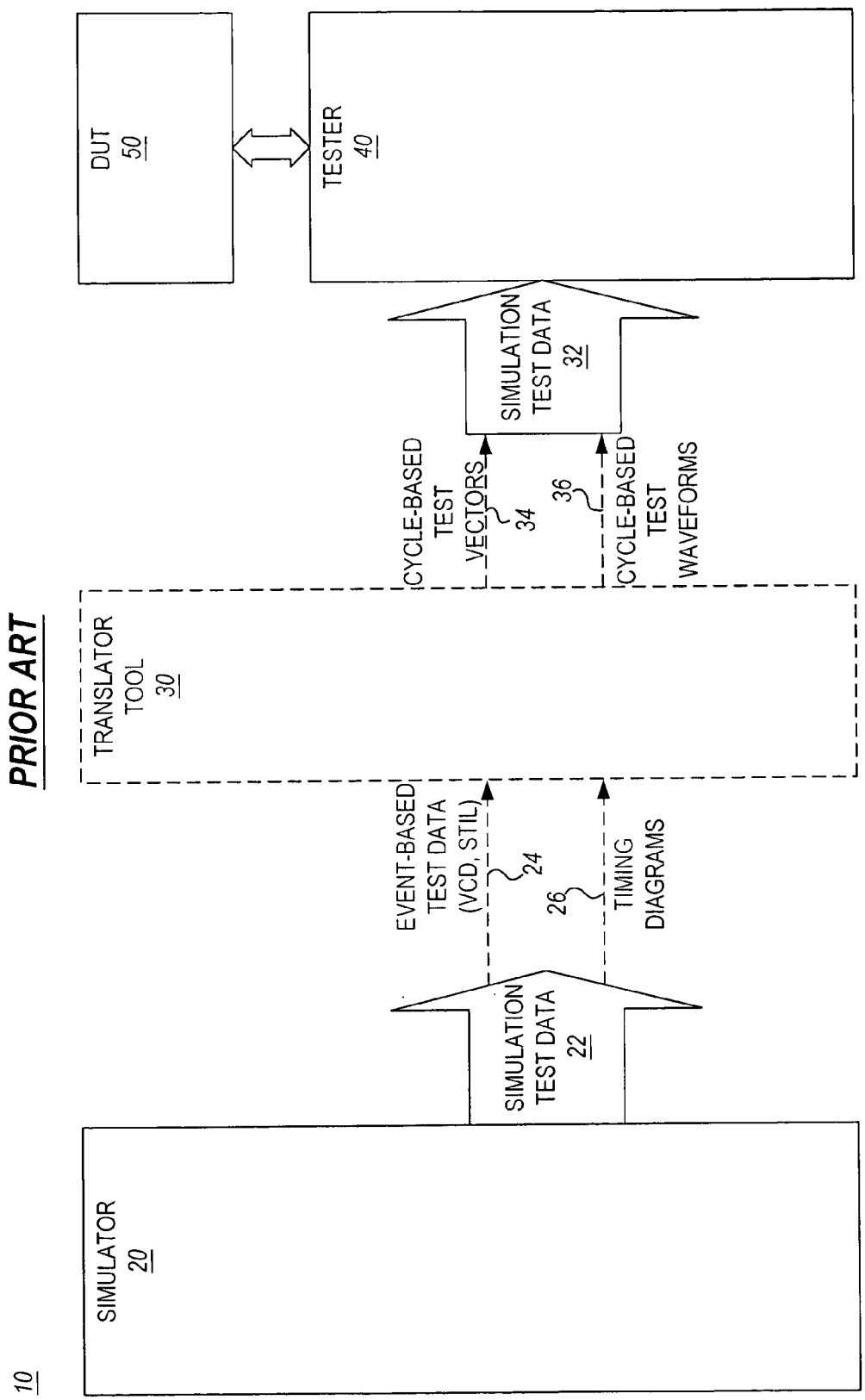
FIG. 1 is a block diagram of a prior art test environment for testing an integrated circuit device.

Turning now to the drawings, FIG. 1 shows a prior art test environment 10 for testing an integrated circuit device (also referred to herein as "device under test", or "DUT") 50. The test environment 10 includes a simulator 20 and an integrated circuit device tester 40, such as an ATE tool. The simulator 20 may be a stand-alone tool, or may be integrated into a multi-functional Electronic Automation Design (EAD) tool, as discussed in the background section. As also discussed in the background section, since simulation test data 22 generated by standardized simulators is typically not in the format required by ATE tools, the test environment 10 will typically require a translator tool 30 to convert the simulation test data 22 into a format 32 usable by the integrated circuit device tester 40. For example, the simulator 20 may generate simulation test data as event-based test data (for example, in VCD or STIL format), and the tester 40 may require test data in the form of cycle-based test data. In this example, the translator tool 30 generates cycle-based test vectors 34 and cycle-based waveforms 36 based on the event-based test data 24 and timing diagrams 26 of the design specification of the integrated circuit device.

As mentioned in the background, translator tools such as translator tool 30 often introduce test flaws into the simulation test data 32 to be executed on the tester 40. In addition, because the focus of a test design is often heavily biased toward passing good parts, often tests may be flawed by design for failing to fail actually bad parts.

Figure 2A:
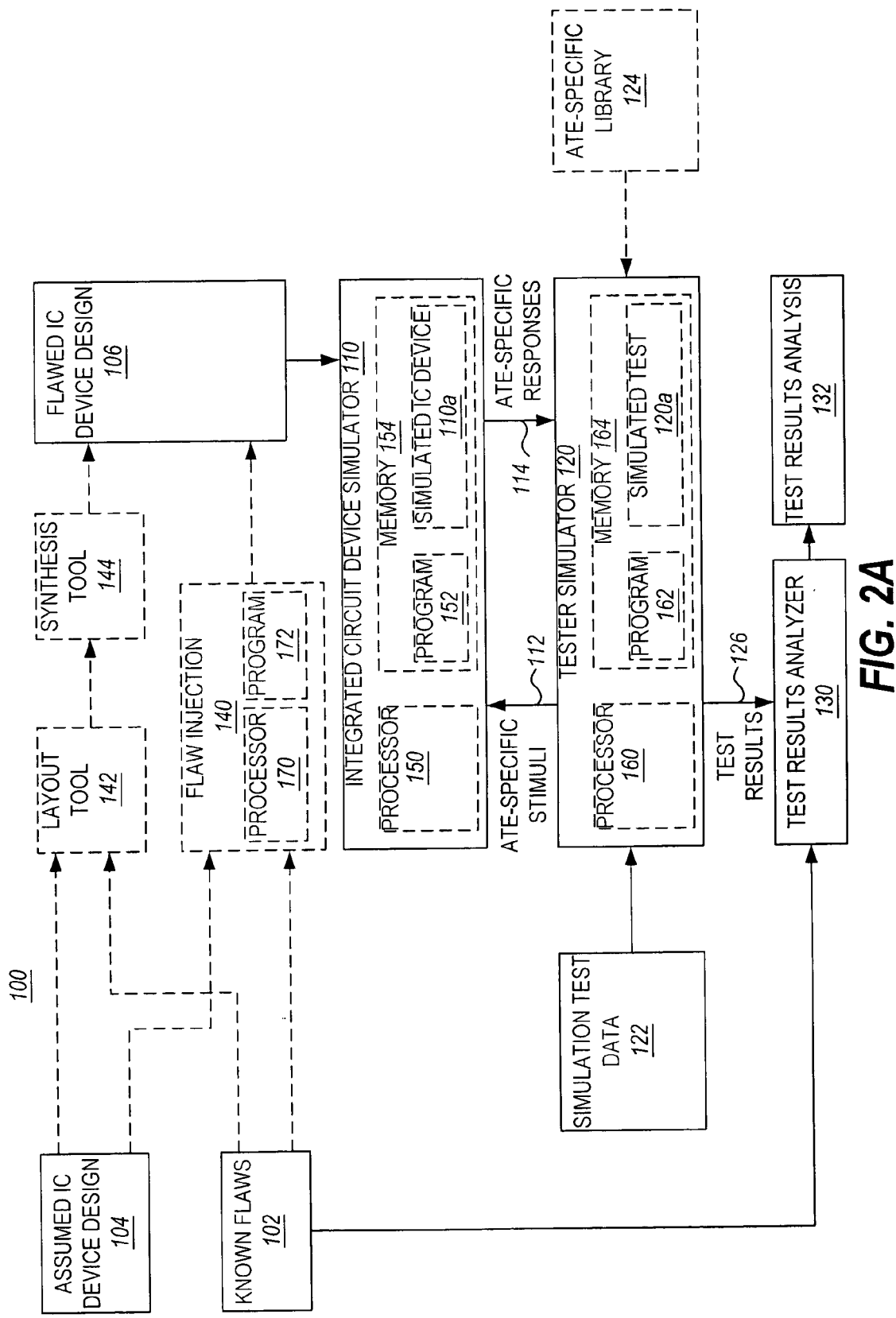
FIG. 2A is a block diagram of a first exemplary embodiment of a resimulation tool implemented in accordance with the invention for performing virtual test.

Turning now to the invention, FIG. 2A is a block diagram of a first embodiment of a resimulation tool 100 implemented in accordance with the invention which verifies the ability of an integrated circuit device test to fail bad parts with known defects prior to actual execution of the test on the real integrated circuit device tester. Resimulation tool 100 includes an integrated circuit device simulator 110 and a tester simulator 120.

The integrated circuit device simulator 110 comprises a processor 150 that executes a simulation program 152 stored in memory 154 that simulates an intentionally flawed integrated circuit device 110a synthesized according to an intentionally flawed integrated circuit device design 106. This can be effected according to one of two preferred methods. In the first method, exemplified in the first embodiment of the resimulation tool 100 of FIG. 2A, the assumed good integrated circuit device design 104 (i.e., the design according to which the physical embodiment of the integrated circuit device is fabricated) is modified to include a set of known integrated circuit device flaws 102 that model one or more known defects of the integrated circuit device to generate a flawed integrated circuit device design 106. For example, referring now to FIG. 3A, in which there is shown a portion of an integrated circuit device 50 comprising metalization layers M1 52a–52h and metalization layers M2 54a–54g. As known in the art, every integrated circuit is fabricated with a plurality of metalization layers. Each metalization layer is printed with a predesigned pattern, typically a number of metal traces formed in straight lines parallel to a defined axis for that respective metalization layer. Metalization layers are sandwiched between dielectric layers, and typically alternate axis orientation. For example, as shown in FIG. 3A, a metalization layer M1 may be laid out such that the traces are parallel to a given axis (e.g., the "X" axis, as shown), whereas a next metalization layer M2 may be laid out such that the traces are parallel to an axis that is perpendicular to the given axis (e.g., the "Y" axis, as shown). Interconnections between metalization layers may be implemented, as shown by the circles in FIG. 3A, using vias. Electronic components such as transistors, diodes, resistors, capacitors, etc., and interconnects between the components, are all implementable according to known design principles in an integrated circuit by suitable metalization layer layout and interconnections.

In the present example, suppose a commonly seen defect in manufacturing is contamination of an integrated circuit device by a dust particle 2 microns in diameter. Suppose further that when an integrated circuit device is contaminated by such a particle, the particle obliterates all metal in the layer being fabricated within the area of the particle. In order to model the defect, the layout of the assumed integrated circuit device design 104 may be modified to remove the metal in the contaminated area. FIG. 3B illustrates a 2 micron diameter particle 60 contaminating the portion of the integrated circuit device 50 of FIG. 3A. As shown in FIG. 3B, the particle 60 obliterates traces 52c and 52d, and a portion of the trace 52e.

Figure 3C:
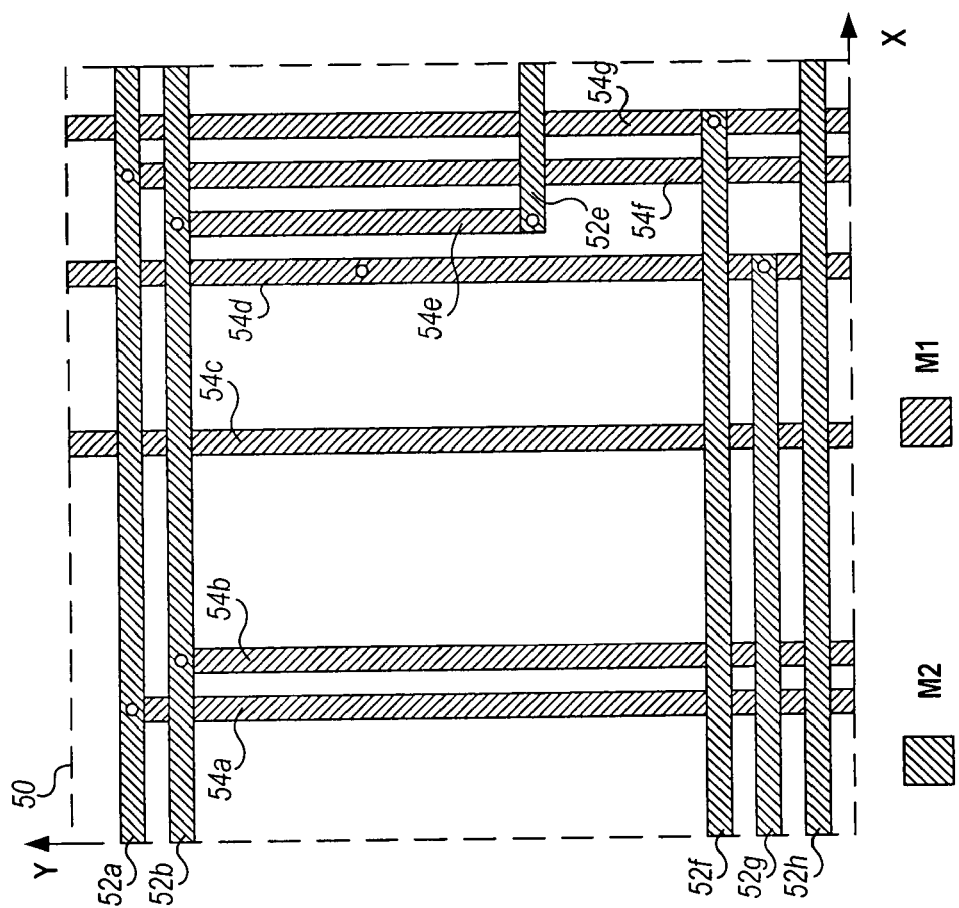
FIG. 3C is a top view of the portion of the integrated circuit of FIG. 3A as modified to remove the traces in the M2 metalization layer that are obliterated by the particle shown in FIG. 3B.

Metal may be removed from the integrated circuit device design by modifying the actual layout of the integrated circuit device design 104 (using a layout tool 142) and resynthesizing the design (i.e., to generate the netlist, for example, by using a design synthesizer tool 144). For example, as shown in FIG. 3C, the M2 metalization layer traces 52c and 52d have been completely removed, and a portion of the trace 52e has been removed, from the original layout of FIG. 3A. (It will be appreciated, of course, by those skilled in the art, that more than one metalization layer may be affected by a defect, and that the appropriate layers are modified in the flawed design).

Alternatively, the defect may be modeled by a flaw injection function 140 which determines which nets in the design netlist are affected by the defect and then removes the affected nets from the netlist or alters the netlist description of the transistors obliterated by the flaw. This method is simpler since the netlist is an abstraction of the layout of the integrated circuit device design, and can be modified by merely redefining the nets in the netlist using a standard hardware description language such as VHDL. An example of a netlist is a Verilog RTL netlist, the characteristics of which are known to those of ordinary skill in the art.

The above-described process is contrary to the prior art practice of modeling only the symptoms of the defect rather than modeling the defect itself. In a preferred embodiment, the integrated circuit device design (and flawed integrated circuit device design) is typically described using the Verilog standard or the VHDL standard (IEEE standard 1364, incorporated herein by reference for all that it teaches). Suitable simulators for simulating the integrated circuit device (and intentionally flawed integrated circuit device) and integrated circuit device tester, to name only a few by example only and not by limitation, are Digital Virtual tester™, Virtual test Emulator, and Test Development Series (EDS) test development software, each manufactured by Credence Corporation, of Milpitas, Calif.

The flaw injection function 142 which modifies the assumed integrated circuit device design 104 with the known flaws 102 to generate the flawed integrated circuit device design 106 can be performed manually by a test developer, or alternatively could be automated to be performed by a flaw injection computer program 172, executed by a computer processor 170, that automatically receives the known flaws 102 and the netlist of the assumed integrated circuit device design 104, automatically determines what nets are affected, and removes the nets from the netlist of the assumed integrated circuit device design 104 to generate the flawed integrated circuit device design 106.

The integrated circuit device simulator 110 receives the flawed integrated circuit device design 106 and simulates a flawed integrated circuit device 110a based on the flawed integrated circuit device design 106. To this end, the simulated flawed integrated circuit device 110a receives test stimuli 112 from a simulated test 120a simulated by the tester simulator 120 and generates test responses 114 that are received by the tester simulator 120.

Tester simulator 120 receives an ATE-ready test 122 to be verified. The ATE-ready test 122 may be a simulated test (e.g. Simulation test data 22 in FIG. 1) that executed properly during design simulation and that has been translated, for example by a translator tool (e.g., translator tool 30 in FIG. 1), to an ATE-ready format (e.g., translated simulation test data 32 in FIG. 1). Alternatively, the ATE-ready test 122 may have been independently developed that simply needs verification that it properly detects and fails devices under test that are characterized by known detects.

The tester simulator 120 comprises a processor 160 that executes a simulation program 162 stored in simulator memory 164 that simulates a simulated integrated circuit device tester 120a the models the actual integrated circuit device tester on which the test will actually be executed to test the physical embodiment of the integrated circuit device. In a preferred embodiment, the tester simulator 120 is a generic simulator that imports an ATE-specific library 124 that allows the generic simulator to model the behavior of the actual ATE that will test the physical embodiment of the integrated circuit device. Alternatively, the tester simulator 120 can be an ATE-specific simulator or emulator that models the behavior of the actual ATE that will test the physical embodiment of the integrated circuit device. In this regard, the tester simulator 120 receives the ATE-ready test 122 and configures itself to send out respective stimuli 112 and receive respective responses 114 from a simulated integrated circuit device 110a being simulated by the integrated circuit device simulator 110.

A test results analyzer 130 processes the results 126 of the simulated test to determine whether the test 122 properly detects (and fails) the known faults and/or defects in a flawed integrated circuit device. Preferably, the test results analyzer 130 generates a test results analysis 132 that indicates whether or not the test properly detects the known faults and/or defects in the flawed integrated circuit device. The test analysis 132 may be as simple as a "go/no-go", "yes/no", "1/0", or other type test that results in a similar binary-type answer, or may be more complicated, generating flaw detection/non-detection on a flaw-by-flaw basis. Verification of the test 122 may alternatively be available from the test analysis 132 only indirectly, requiring a technician to extract from the test analysis whether the known flaws were detected by the test.

Figure 2B:
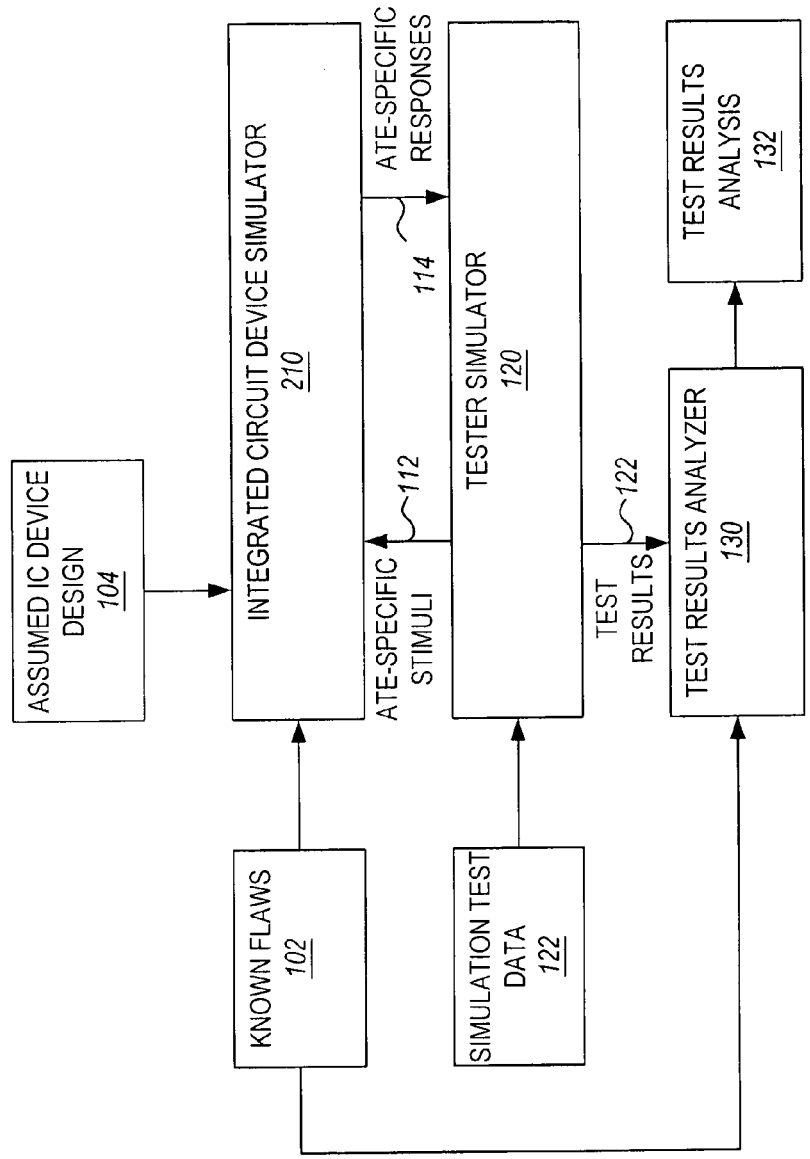
FIG. 2B is a block diagram of a second exemplary embodiment of a resimulation tool implemented in accordance with the invention for performing virtual test.

The second method for simulating an intentionally flawed integrated circuit device synthesized according to an intentionally flawed integrated circuit device design 106 is illustrated in a second embodiment of the resimulation tool 200, shown in FIG. 2B. In this embodiment, the assumed good integrated circuit device design 104 and set of known integrated circuit device flaws 102 that model one or more known defects of the integrated circuit device are each input directly to a "smart" integrated circuit device simulator 210. The "smart" integrated circuit device simulator 210 integrates the known flaws into the assumed integrated circuit device design 104 during simulation to simulate a flawed integrated circuit device 210a.

The operation of the "smart" integrated circuit device simulator 210 as seen by the tester simulator 120 is similar to that of the integrated circuit device simulator 110 of FIG. 110 from the perspective of the tester simulator 120 in that the "smart" integrated circuit device simulator 210 simulates the flawed integrated circuit device by receiving test stimuli 112 from the tester simulator and generating test responses 114 that are received by the tester simulator 120.

The tester simulator 120 and test results analyzer 130 and operation thereof are the same as described with respect to FIG. 2A.

FIG. 4 is a flowchart illustrating the method 300 of the invention for verifying an integrated circuit device test for testing an integrated circuit prior to actual execution on a real tester. As illustrated, the method begins with the generation of an integrated circuit device design that meets predetermined specifications of an integrated circuit (step 301). The method 300 then models known integrated circuit device flaws (i.e., integrated circuit defects) (step 302) and modifies the integrated circuit device design to include the known flaws to generate a flawed integrated circuit device design (step 303). The method then simulates a flawed integrated circuit based on the flawed integrated circuit device design (step 304). The method simulates the integrated circuit device test to simulate a test of the simulated flawed integrated circuit (step 305). The method 300 then analyzes the test results of the simulation (step 306) to determine whether the simulated test of the simulated flawed integrated circuit discovered the known flaws in the simulated flawed integrated circuit device (step 307). If the flaws are discovered, the test is presumed good for the purpose of discovering the known flaws in actual integrated circuit devices implemented according to the assumed good integrated circuit device design (step 309). If the simulated test of the simulated flawed integrated circuit does not discover the known flaws in the simulated flawed integrated circuit device, the method 300 indicates that the integrated circuit device test is flawed (step 309).

As described in detail above, the invention verifies, prior to actual execution on an integrated circuit device tester, that integrated circuit device tests will detect and fail integrated circuit devices that are flawed with known defects (especially actual defects that show up in manufacturing) by modeling defects themselves rather than the symptoms of the defects (which show up as faults). Defect modeling as described in the present invention may become more prevalent as fault modeling begins to break down. As integrated circuit processes shrink and become faster, the physics of the integrated circuit are also changing, often in ways that are currently unknown. For example, as the industry is moving to a 65 NM (nanometer) process, the assumption is that the background leakage of the transistors will be higher; however, what passes as an acceptable level of transistor leakage is as yet unknown. These physical changes may require changes in the way tests are developed and may cause some tests that are currently in use today to become obsolete. In the above example, because the background transistor leakage will increase, it is possible that tests such as IDDQ test, which operates generally to measure the operating current of the device and to declare the device bad if the operating current is above a predefined threshold, will no longer be very indicative of the health of the integrated circuit (i.e., it may be that a chip that runs hot but runs correctly).

Because of the change in physics of integrated circuit devices due to smaller processes and higher speeds, the defects themselves are becoming more subtle, causing more difficulty in modeling the defects as identifiable faults. For example, integrated circuits with smaller processes and higher speeds now can exhibit resistive faults, where at low speed everything passes, and at high speed everything fails. In a process with a hundred million transistors and corresponding interconnecting wires, fault modeling is becoming more and more difficult.

Accordingly, eventually test development may reach a point at which it is no longer practical to accurately model defects as faults. In this case, however, the defect modeling technique of the invention may still be used to model the defects themselves (rather than modeling the fault or symptom of the defect) to verify that the test actually detects the defect in the device and actually fails the device.

The present invention accounts for these problems by modifying the assumed good integrated circuit device design to model the actual defects themselves, and verifying that the test actually detects the "real" simulated defects. The invention injects known defects, preferably obtained from actual manufacturing data and/or experience, into the integrated circuit device design to generate a flawed integrated circuit device design that models the actual defects. The invention then simulates the test on a simulated flawed integrated circuit device (flawed according to the flawed integrated circuit device design) to determine whether the test detects the flaw(s) and fails the part as it should. The invention is performed entirely by simulation—simulation of both the integrated circuit device tester and the flawed integrated circuit device itself. This allows verification of the test to be conducted in parallel with the fabrication of, and/or prior to the availability of, the physical embodiment of the integrated circuit device that will be tested on the actual tester using the verified test. Accordingly, the invention is advantageous in the present testing environment for the above reasons, and in the future testing environment as fault modeling becomes more complex and time-consuming.

Although this preferred embodiment of the present invention has been disclosed for illustrative purposes, those skilled in the art will appreciate that various modifications, additions and substitutions are possible, without departing from the scope and spirit of the invention as disclosed in the accompanying claims. For example, it should be understood that the term "integrated circuit device" as used in both the specification and the claims includes any physical embodiment generated from all phases of integrated circuit fabrication herein known or hereinafter developed, including integrated circuit wafers, integrated circuit dies, packaged integrated circuits, printed circuit boards with integrated circuits thereon, and assembled systems with printed circuit boards therein. Similarly, the term "simulates" refers to execution of any process that models or performs the actual behavior of a device being simulated. The term "simulator" refers to any apparatus, implemented in either software or hardware or a combination of software and hardware, that models or performs the actual behavior of a device being simulated. Accordingly, the term "simulator" includes simulators comprising software that models the behavior of the device being simulated but that is executed on different hardware, and emulators comprising actual tester software and actual hardware on which the actual tester software can be executed (typically including the processor, registers, and memory, but without full functionality of an actual tester itself), or any equivalent thereof. It is also possible that other benefits or uses of the currently disclosed invention will become apparent over time.

What is claimed is:

1. A method for verifying an integrated circuit device test for testing an integrated circuit device, said method comprising the steps of:
    simulating a flawed integrated circuit device design comprising a good integrated circuit design modified to include one or more known physical flaws in the good integrated circuit device design;
    simulating said integrated circuit device test to test said simulated flawed integrated circuit device design; and
    determining whether said simulated test of said simulated flawed integrated circuit device design discovered said one or more known physical flaws in said simulated flawed integrated circuit device design.

2. The method of claim 1, further comprising the step of:
    indicating that said integrated circuit device test is flawed if said simulated test of said simulated flawed integrated circuit device design does not discover said one or more known physical flaws in said simulated flawed integrated circuit device design.

3. The method of claim 1, further comprising the step of:
    indicating that said integrated circuit device test is flawed if said simulated test of said simulated flawed integrated circuit device design does not discover said one or more known physical flaws in said simulated flawed integrated circuit device design.

4. The method of claim 1, further comprising the step of:
    simulating said good integrated circuit device design.

5. The method of claim 4, further comprising the step of:
    simulating said integrated circuit device test to test said simulated good integrated circuit device design; and
    indicating that said integrated circuit device test is flawed if said simulated test of said simulated good integrated circuit device design does not pass.

6. The method in accordance with claim 5, wherein:
    the flawed integrated circuit device design comprises the good integrated circuit device design modified to include the one or more known physical flaws.

7. The method of claim 6, further comprising the step of:
    indicating that said integrated circuit device test is flawed if said simulated test of said simulated flawed integrated circuit device design does not discover said one or more known physical flaws in said simulated flawed integrated circuit device design.

8. The method of claim 1, comprising the step of:
    modifying said good integrated circuit device design to include said one or more known physical flaws to generate said flawed integrated circuit device design.

9. The method of claim 8, further comprising the step of:
    indicating that said integrated circuit device test is flawed if said simulated test of said simulated flawed integrated circuit device design does not discover said one or more known physical flaws in said simulated flawed integrated circuit device design.

10. The method of claim 8, further comprising the first step of:
    simulating said good integrated circuit device design.

11. The method of claim 10, further comprising the step of:
    simulating said integrated circuit device test to test said simulated good integrated circuit device design; and
    indicating that said integrated circuit device test is flawed if said simulated test of said simulated good integrated circuit device design does not pass.

12. The method of claim 11, wherein:
    the sawed integrated circuit device design comprises the good integrated circuit device design modified to include the one or more known physical flaws.

13. The method of claim 12, further comprising the step of:
    indicating that said integrated circuit device test is flawed if said simulated test of said simulated flawed integrated circuit device design does not discover said one or more known physical flaws in said simulated flawed integrated circuit device design.

14. A computer readable storage medium tangibly embodying program instructions implementing a method for verifying an integrated circuit device test for testing an integrated circuit device, said method comprising the steps of:
    simulating a flawed integrated circuit device design comprising a good integrated circuit design modified to include one or more known physical flaws in the good integrated circuit device design;
    simulating said integrated circuit device test to test said simulated flawed integrated circuit device design; and
    determining whether said simulated test of said simulated flawed integrated circuit device design discovered said one or more known physical flaws in said simulated flawed integrated circuit device design.

15. The computer readable storage medium of claim 14, further comprising the step of:
  indicating that said integrated circuit device test is flawed it said simulated test of said simulated flawed integrated circuit device design does not discover said one or more known physical flaws in said simulated flawed integrated circuit device design.

16. The computer readable storage medium of claim 14, further comprising the step of:
  indicating that said integrated circuit device test is flawed if said simulated test of said simulated flawed integrated circuit device design does not discover said one or more known physical flaws in said simulated flawed integrated circuit device design.

17. The computer readable storage medium of claim 14, further comprising the first step of:
  simulating said good integrated circuit device design.

18. The computer readable storage medium of claim 17, further comprising the step of:
  simulating said integrated circuit device test to test said simulated good integrated circuit device design; and
  indicating that said integrated circuit device test is flawed if said simulated test of said simulated good integrated circuit device design does not pass.

19. The computer readable storage medium of claim 18, wherein:
  the flawed integrated circuit device design comprises the good integrated circuit device design modified to include the one or more known physical flaws.

20. The computer readable storage medium of claim 19, further comprising the step of:
  indicating that said integrated circuit device test is flawed if said simulated test of said simulated flawed integrated circuit device design does not discover said one or more known physical flaws in said simulated flawed integrated circuit device design.

21. The computer readable storage medium of claim 14, comprising the step of:
  modifying said good integrated circuit device design to include said one or more known flaws to generate said flawed integrated circuit device design.

22. The computer readable storage medium of claim 21, further comprising the step of:
  indicating that said integrated circuit device test is flawed if said simulated test of said simulated flawed integrated circuit device design does not discover said one or more known physical flaws in said simulated flawed integrated circuit device design.

23. The computer readable storage medium of claim 21, further comprising the step of:
  simulating said good integrated circuit device design.

24. The computer readable storage medium of claim 23, further comprising the step of:
  simulating said integrated circuit device test to test said simulated good integrated circuit device design; and
  indicating that said integrated circuit device test is flawed if said simulated test of said simulated good integrated circuit device design does not pass.

25. The computer readable storage medium of claim 24, wherein:
  the flawed integrated circuit device design comprises the good integrated circuit device design modified to include the one or more known physical flaws.

26. The computer readable storage medium of claim 25, further comprising the step of:
  indicating that said integrated circuit device test is flawed if said simulated test of said simulated flawed integrated circuit device design does not discover said one or more known physical flaws in said simulated flawed integrated circuit device design.

27. An integrated circuit device test verification apparatus, comprising:
  an integrated circuit device simulator which simulates a flawed integrated circuit device design, said flawed integrated circuit device design comprising a good integrated circuit design modified to include one or more known physical flaws in the good integrated circuit device design;
  a tester simulator which simulates an integrated circuit device test executing on an integrated circuit device tester that generates test stimuli, applies said generated test stimuli to said simulated flawed integrated circuit device design, and receives test responses from said simulated flawed integrated overcut device design; and
  a simulated test results analyzer which determines whether said simulated integrated circuit device test of said simulated flawed integrated circuit device design discovered said one or more known physical flaws in said flawed integrated circuit device design.

28. The integrated circuit device test verification apparatus of claim 27, wherein:
  said simulated test results analyzer determines that said integrated circuit device test is flawed if said simulated test of said simulated flawed integrated circuit device design does not discover said one or more known physical flaws in said simulated flawed integrated circuit device design.

29. The integrated circuit device test verification apparatus of claim 27, wherein:
  said integrated circuit device simulator also simulates said good integrated circuit device design;
  said tester simulator simulates said integrated circuit device test executing on said integrated circuit device tester, and applies said generated test stimuli to said simulated good integrated circuit device design, and receives test responses from said simulated good integrated circuit device design; and
  said simulated test results analyzer determines whether said simulated test of said simulated good integrated circuit device design passes said simulated good integrated circuit device design.

30. The integrated circuit device test verification apparatus of claim 29, wherein:
  said simulated test results analyzer determines that said integrated circuit device test is flawed if said simulated test of said simulated good integrated circuit device design does not pass said simulated good integrated circuit device design.

* * * * *